(12) United States Patent
Moon et al.

(10) Patent No.: US 7,683,897 B2
(45) Date of Patent: Mar. 23, 2010

(54) DATA DRIVER CAPABLE OF AN OFFSET COMPENSATION AND DISPLAY APPARATUS HAVING THE SAME

(75) Inventors: Kook-Chul Moon, Suwon-si (KR); Il-Gon Kim, Seoul (KR); Tae-Hyeong Park, Yongin-si (KR); Chul-Ho Kim, Seoul (KR); Cheol-Min Kim, Seongnam-si (KR); Kee-Chan Park, Suwon-si (KR)

(73) Assignee: Samsung Electronics, Co., Ltd., Suwon-Si (KR)

( * ) Notice: Subject to any disclaimer, the term of this patent is extended or adjusted under 35 U.S.C. 154(b) by 850 days.

(21) Appl. No.: 11/497,996

(22) Filed: Aug. 2, 2006

(65) Prior Publication Data

US 2006/0267915 A1 Nov. 30, 2006

Related U.S. Application Data

(62) Division of application No. 10/894,296, filed on Jul. 19, 2004, now Pat. No. 7,106,136.

(30) Foreign Application Priority Data

Jan. 19, 2004 (KR) .................................. 2004-3915

(51) Int. Cl.
*G06F 3/038* (2006.01)
(52) U.S. Cl. ..................................................... 345/204
(58) Field of Classification Search ........... 345/98–100, 345/204
See application file for complete search history.

(56) References Cited

U.S. PATENT DOCUMENTS 5,070,307 A * 12/1991 Ta ............................... 330/253
5,285,168 A * 2/1994 Tomatsu et al. .............. 330/253
5,751,186 A * 5/1998 Nakao ........................... 327/562

(Continued)

FOREIGN PATENT DOCUMENTS

JP 61-148906 7/1986

(Continued)

OTHER PUBLICATIONS

English Abstract for Publication No. 61-148906.

(Continued)

*Primary Examiner*—Richard Hjerpe
*Assistant Examiner*—Andrew Schnirel
(74) *Attorney, Agent, or Firm*—F. Chau & Associates, LLC

(57) ABSTRACT

An amplifier includes a biasing section, first and second differential amplifying sections and an output section. The biasing section outputs first and second bias currents based on first and second power source voltages. The first differential amplifying section outputs a first amplified voltage based on the first bias current. The second differential amplifying section outputs a second amplified voltage based on the second bias current. The output section outputs the second power source voltage based on the first amplified voltage and the first power source voltage, and outputs the first power source voltage based on the second amplified voltage and the second power source voltage. Therefore, a variation of the threshold voltage is compensated to enhance display quality.

11 Claims, 6 Drawing Sheets

U.S. PATENT DOCUMENTS

| | | | |
|---|---|---|---|
| 6,236,269 B1 * | 5/2001 | Hojabri | 330/253 |
| 6,281,891 B1 * | 8/2001 | DaCosta et al. | 345/206 |
| 6,522,323 B1 * | 2/2003 | Sasaki et al. | 345/204 |
| 6,845,140 B2 * | 1/2005 | Moon et al. | 377/78 |
| 2003/0231734 A1 * | 12/2003 | Fujita et al. | 377/64 |

FOREIGN PATENT DOCUMENTS

| | | |
|---|---|---|
| JP | 62-015910 | 1/1987 |
| JP | 2004-004241 | 1/2004 |

OTHER PUBLICATIONS

English Abstract for Publication No. 62-015910.

English Abstract for Publication No. 2004-004241.

* cited by examiner

DATA DRIVER CAPABLE OF AN OFFSET COMPENSATION AND DISPLAY APPARATUS HAVING THE SAME

CROSS-REFERENCE TO RELATED APPLICATIONS

This application is a Divisional of U.S. application Ser. No. 10/894,296 filed on Jul. 19, 2004, now U.S. Pat. No. 7,106,136 which claims priority to Korean Patent Application No. 2004-3915, filed on Jan. 19, 2004.

BACKGROUND OF THE INVENTION

1. Field of the Invention

The present invention relates to an amplifier, a data driver and a display apparatus having the amplifier. More particularly, the present invention relates to an amplifier capable of an offset compensation, a data driver and a display apparatus having the amplifier.

2. Description of the Related Art

Generally, a polysilicon thin film transistor (p-Si TFT) is widely used for a driver circuit of a liquid crystal display apparatus. Recently, the SOG (System On Glass) product including not only a gate driver circuit but also a source driver integrated circuit (IC) that is mounted on glass is under development.

A source follower amplifier is connected to an output terminal of a digital-analog converter (DAC) in the source driver IC. There are various kinds of source follower amplifier. One of the source amplifiers is a compensation type OP-AMP. The compensation type OP-AMP has wide range output, high speed and good linearity.

FIG. 1 is a circuit diagram illustrating a conventional push-pull amplifier. In detail, FIG. 1 is a circuit diagram illustrating a conventional push-pull amplifier having a compensation type OP-AMP.

Referring to FIG. 1, a conventional push-pull amplifier includes a biasing section 10, a first differential amplifying section 20, a second differential amplifying section 30 and an output section 40.

The first biasing section 10 provides first and second bias currents to the first and second differential amplifying sections 20 and 30, respectively, based on first and second power source voltages VDD and VSS.

The first differential amplifying section 20 includes P-channel differential pair having N-channel current mirror. The first differential amplifying section 20 amplifies a difference between an external input voltage and an output voltage based on the first bias current to provide the output section 40 with a first amplified voltage corresponding to the amplified difference.

The second differential amplifying section 30 includes N-channel differential pair having P-channel current mirror. The second differential amplifying section 30 amplifies a difference between an external input voltage and an output voltage based on the second bias current to provide the output section 40 with a second amplified voltage corresponding to the amplified difference.

The output section 40 pulls down the output voltage VOUT to output the second power source voltage VSS based on the first amplified voltage, and the output section 40 pulls up the output voltage VOUT to output the first power source voltage VDD based on the second amplified voltage.

When a threshold voltage of an N-channel transistor is raised, the first and second amplified voltages outputted from the first and second differential amplifying sections 20 and 30, respectively, are raised. Therefore, a linear region is deformed, as the first and second amplified voltages are increased, so that variations between inputs and outputs occur. For the same reason, a change in a threshold voltage of a P-channel transistor influences the outputs.

Therefore, when the OP-AMP employs the p-Si TFT, a large variation of the output occurs even when same input voltage is applied to the OP-AMP. The variation of the output is referred to as "offset" or "offset voltage". The offset shows large variance in accordance with the characteristics of transistors.

The liquid crystal display panel includes a plurality of p-SI TFTs, and the p-Si TFTs show large variance in threshold voltage Vth over the panels, even within a panel. Therefore, when the variation of the threshold voltage is not compensated, different outputs are outputted in accordance with the pixels of the liquid crystal display panel, even though same data voltage is applied to the p-Si TFTs of the liquid crystal display panel. Therefore, display quality is lowered.

SUMMARY OF THE INVENTION

The present invention provides an amplifier capable of an offset compensation.

The present invention also provides a data driver having the amplifier.

The present invention also provides a display apparatus having the amplifier.

In an exemplary amplifier according to the present invention, the amplifier includes a biasing section, first and second differential amplifying sections and an output section. The biasing section outputs first and second bias currents based on first and second power source voltages. The first differential amplifying section outputs a first amplified voltage based on the first bias current. The second differential amplifying section outputs a second amplified voltage based on the second bias current. The output section outputs the second power source voltage based on the first amplified voltage and the first power source voltage, and outputs the first power source voltage based on the second amplified voltage and the second power source voltage.

In an exemplary data driver according to the present invention, the data driver includes a digital-analog converter and a buffer. The digital-analog converter receives image data to convert the image data into analog voltage. The buffer outputs a second power source voltage based on a first power source voltage and a first amplified voltage corresponding to the first analog voltage, and the buffer outputs a first power source voltage based on a second power source voltage and a second amplified voltage corresponding to the first analog voltage.

In an exemplary display apparatus according to the present invention, the display apparatus includes a display panel, a timing control section, a scan driver and a data driver. The display panel includes a data line, a scan line and a switching device formed in a region defined by the data line and the scan line. The timing control section outputs image data, and first and second timing signals. The scan driver outputs a scan signal activating the scan line based on the first timing signal. The data driver includes a digital-analog converter that receives the image data to convert the image data into analog voltage and a buffer that outputs a second power source voltage based on a first power source voltage and a first amplified voltage corresponding to the first analog voltage and outputs a first power source voltage based on a second power source voltage and a second amplified voltage corresponding to the first analog voltage.

According to the present invention, a variation of the threshold voltage is compensated to enhance display quality.

BRIEF DESCRIPTION OF THE DRAWINGS

The above and other features and advantages of the present invention will become more apparent by describing in detailed exemplary embodiments thereof with reference to the accompanying drawings, in which.

DESCRIPTION OF EMBODIMENTS

Hereinafter the embodiments of the present invention will be described in detail with reference to the accompanied drawings.

Figure 2:
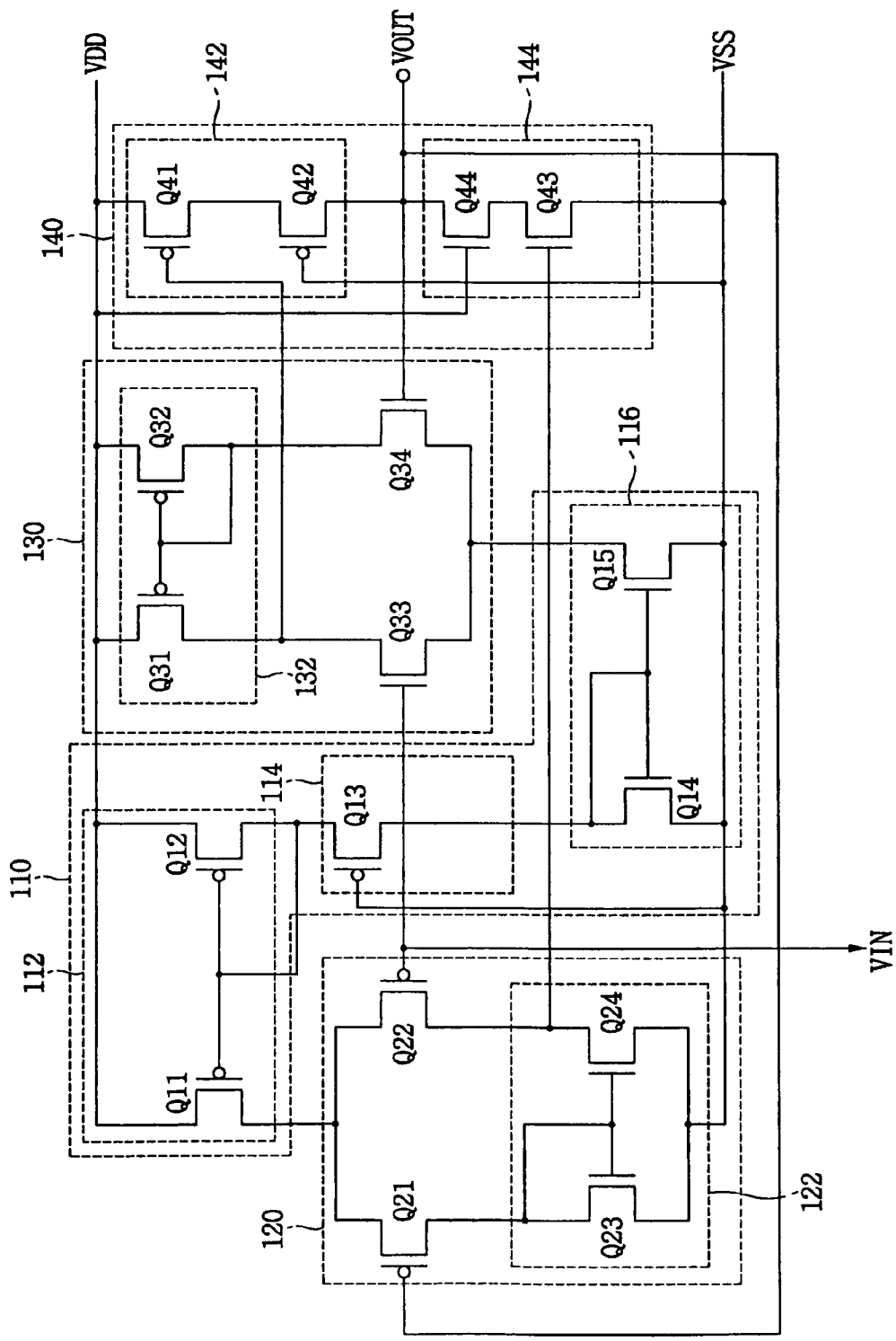
FIG. 2 is a circuit diagram illustrating a push-pull amplifier according to an exemplary embodiment of the present invention.

FIG. 2 is a circuit diagram illustrating a push-pull amplifier according to an exemplary embodiment of the present invention.

Referring to FIG. 2, a push-pull amplifier according to an exemplary embodiment of the present invention includes a biasing section 110, a first differential amplifying section 120, a second differential amplifying section 130 and an output section 140.

The biasing section 110 includes a first current mirror 112, a bias connection part 114 and a second current mirror 116. The biasing section 110 provides the first and second differential amplifying sections 120 and 130 with first and second bias currents, respectively, based on first and second power source voltages VDD and VSS.

The biasing section 110 set a reference of an input signal VIN by applying a direct current to transistors of the first and second differential amplifying sections 120 and 130 to make a constant current flow, when the input signal VIN is not applied When biasing of the biasing section 110 is changed, the first and second differential amplifying sections 120 and 130 cannot amplify signal exactly. Furthermore, operations of circuits are unstable, and transistors may be damaged by thermal shocks.

In detail, the first current mirror 112 includes P-channel transistors Q11 and Q12. The P-channel transistor Q11 includes a drain electrode that is electrically connected to the first power source voltage VDD, a source electrode that is electrically connected to the first differential amplifying section 120, and a gate electrode that is electrically connected to gate and source electrodes of the P-channel transistor Q12. The P-channel transistor Q12 includes a drain electrode that is electrically connected to the first power source voltage VDD, and gate and source electrodes that are electrically connected to the gate electrode of the P-channel transistor Q11.

The bias connection part 114 includes a P-channel transistor Q13 that receives the first bias current outputted from the source electrode of the P-channel transistor Q12 to provide the second current mirror 116 with a substantially same level bias current as the first bias current.

The second current mirror 116 includes N-channel transistors Q14 and Q15. The N-channel transistor Q14 includes drain and gate electrodes that are electrically connected to the bias connection part 114 to receive the bias current, and a source electrode that is electrically connected to the second power source voltage VSS. The N-channel transistor Q15 includes a drain electrode that is electrically connected to the second differential amplifying section 130, a gate electrode that is electrically connected to the gate electrode of the N-channel transistor Q14, and a source electrode that is electrically connected to the second power source voltage VSS. Therefore, the second current mirror 116 controls the second bias current to apply to the second differential amplifying section 130.

The first differential amplifying section 120 includes a P-channel differential pair having a third current mirror 122 of N-channel. The first differential amplifying section 120 amplifies the difference between the input voltage VIN and the output voltage VOUT fed back from an output terminal of the output section 140 to form a first amplified voltage based on the first bias current provided from the biasing section 110. The first amplified voltage is applied to the output section 140.

Particularly, the P-channel differential pair includes P-channel transistors Q21 and Q22. The P-channel transistor Q21 includes a drain electrode that is electrically connected to the first current mirror 112, a gate electrode that is electrically connected to the output terminal of the output section 140 to receive the output voltage VOUT, and a source electrode that is electrically connected to the third current mirror 122 of N-channel. The P-channel transistor Q22 includes a drain electrode that is electrically connected to the first current mirror 112, a gate electrode that receives the input voltage VIN, and a source electrode that is electrically connected to the third current mirror 122.

The third current mirror 122 includes N-channel transistors Q23 and Q24. The N-channel transistor Q23 includes gate and drain electrodes that are electrically connected to the source electrode of the P-channel transistor Q21, and a source electrode that is electrically connected to the second power source voltage VSS. The N-channel transistor Q24 includes gate electrode that is electrically connected to the gate electrode of the N-channel transistor Q23, a source electrode that is electrically connected to the second power source voltage VSS, and a drain electrode that is electrically connected to the source electrode of the P-channel transistor Q22 and the output section 140.

The second differential amplifying section 130 includes an N-channel differential pair having P-channel current mirror 132. The second differential amplifying section 130 amplifies a difference between the input voltage VIN and the output voltage VOUT fed back from the output terminal of the output section 140 to form a second amplified voltage based on the second bias current pulled down by the biasing section 110. The second amplified voltage is applied to the output section 140.

In detail, the P-channel current mirror 132 includes P-channel transistors Q31 and Q32. The P-channel transistor Q31 includes a drain electrode that is electrically connected to the first power source voltage VDD, and a source electrode that is electrically connected to the N-channel differential pair and the output section 140. The P-channel transistor Q32 includes drain and gate electrodes that are electrically connected to a drain electrode of the P-channel transistor Q31, and a source electrode that is electrically connected to the N-channel differential pair.

The N-channel differential pair includes N-channel transistors Q33 and Q34. The N-channel transistors Q33 includes a drain electrode that is electrically connected to the source electrode of the P-channel transistor Q31, a gate electrode that is electrically connected to the first differential amplifying section 120 to receive the input voltage VIN, and a source electrode that is electrically connected to the N-channel transistor Q15 of the second current mirror 116. The N-channel transistor Q34 includes a drain electrode that is electrically connected to the source electrode of the P-channel transistor Q32, a source electrode that is electrically connected to the P-channel transistor Q15 of the second current mirror 116, and a gate electrode that is electrically connected to the output section 140.

The output section 140 includes a first output compensating section 142 and a second output compensating section 144. The output section 140 attenuates a difference between the first amplified voltage and the second amplified voltage to output the output voltage VOUT. The output voltage VOUT is fed back to the first and second differential amplifying sections 120 and 130.

In detail, the first output compensating section 142 includes P-channel transistors Q41 and Q42. The P-channel transistor Q41 includes a drain electrode that is electrically connected to the first power source voltage VDD, and a gate electrode that is electrically connected to the second differential amplifying section 130. The P-channel transistor Q42 includes a drain electrode that is electrically connected to a source electrode of the P-channel transistor Q41, a gate electrode that is electrically connected to the second power source voltage VSS, and a source electrode that is electrically connected to the output terminal, the first and second differential amplifying sections 120 and 130.

When the P-channel transistor Q41 is turned on, the P-channel transistor Q41 pulls up the output voltage VOUT to output the first power source voltage VDD in response to the second amplified signal applied to the gate electrode, and the P-channel transistor Q41 applies the first power source voltage VDD to the P-channel transistor Q42 though the source electrode. The P-channel transistor Q42 applies the first power source voltage VDD to the output terminal and the first and second differential amplifying sections 120 and 130.

In FIG. 2, the second power source voltage VSS is applied to the gate electrode of the P-channel transistor Q42 that controls output of the pull up voltage in response to the second amplified voltage. However, a separate bias voltage may be applied to the gate electrode of the P-channel transistor Q42.

The second output compensating section 144 includes N-channel transistors Q43 and Q44. The N-channel transistor Q43 includes a source electrode that is electrically connected to the second power source voltage VSS, and a gate electrode that is electrically connected to the first differential amplifying section 120. The N-channel transistor Q44 includes a drain electrode that is electrically connected to the output terminal, a gate electrode that is electrically connected to the first power source voltage VDD, and a source electrode that is electrically connected to a drain electrode of the N-channel transistor Q43.

When the N-channel transistor Q43 is turned on, the N-channel transistor Q43 pulls down the output voltage VOUT to output the second power source voltage VSS in response to the first amplified signal applied to the gate electrode, and the N-channel transistor Q43 applies the second power source voltage VSS to the N-channel transistor Q44 though the drain electrode. The N-channel transistor Q44 applies the second power source voltage VSS to the output terminal and the first and second differential amplifying sections 120 and 130.

In FIG. 2, the first power source voltage VDD is applied to the gate electrode of the N-channel transistor Q44 that controls output of the pull down voltage in response to the first amplified voltage. However, a separate bias voltage may be applied to the gate electrode of the N-channel transistor Q44.

According to the present embodiment, the output section 140 includes transistors that compensate offset voltage of the first and second differential amplifying sections 120 and 130, so that the output section 140 attenuates a difference between the first amplified voltage and the second amplified voltage to output the output voltage VOUT.

Figure 3:
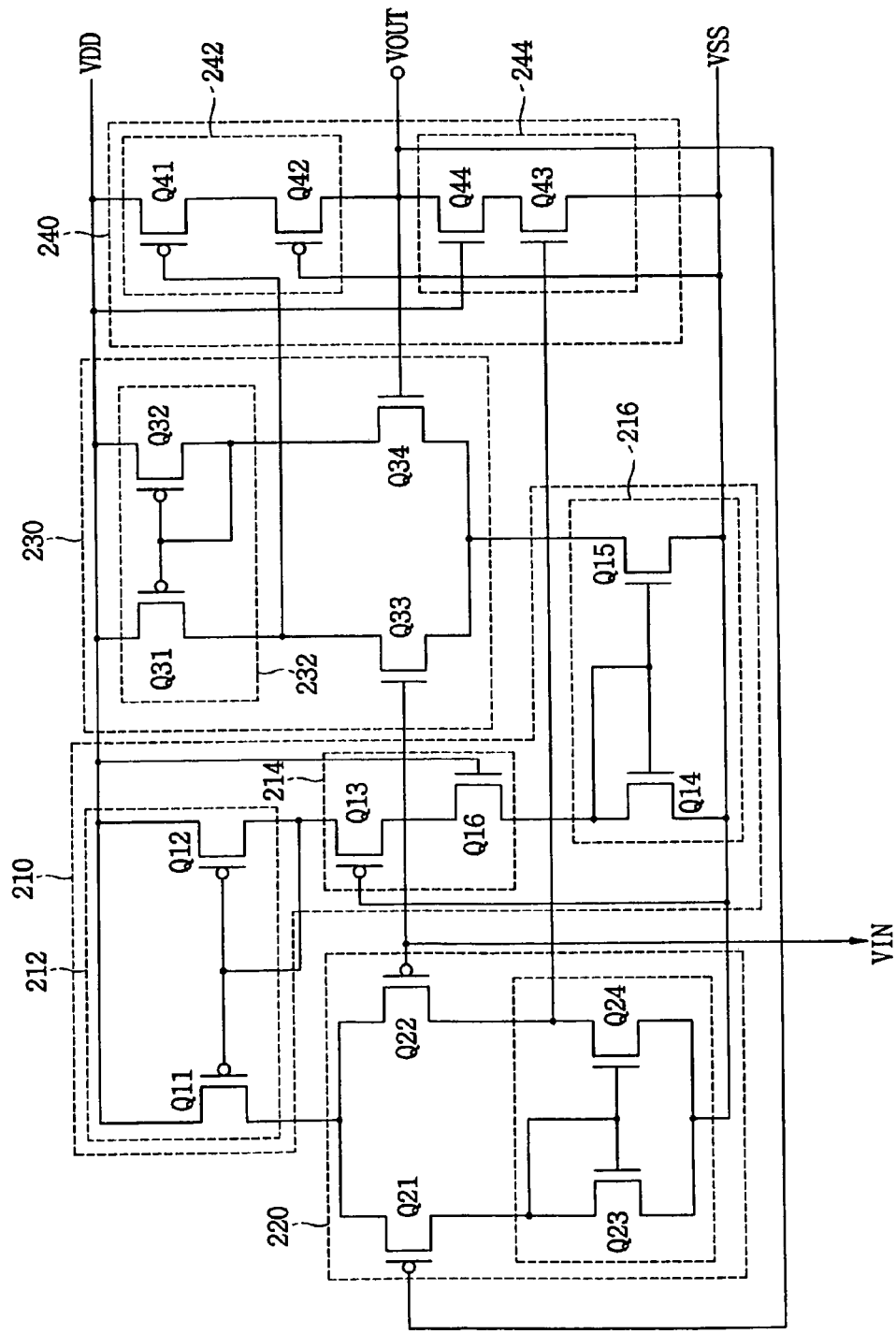
FIG. 3 is a circuit diagram illustrating a push-pull amplifier according to another exemplary embodiment of the present invention.

FIG. 3 is a circuit diagram illustrating a push-pull amplifier according to another exemplary embodiment of the present invention.

Referring to FIG. 3, a push-pull amplifier according to another exemplary embodiment of the present invention includes a biasing section 210, a first differential amplifying section 220, a second amplifying section 230 and an output section 240.

The biasing section 210 includes a first current mirror 212, a first compensating section 214 and a second current mirror 216. The biasing section 210 provides the first and second differential amplifying sections 220 and 230 with first and second bias currents, respectively, based on first and second power source voltages VDD and VSS.

In detail, the first current mirror 212 includes P-channel transistors Q11 and Q12 to provide the first bias currents to the first differential amplifying section 220. The P-channel transistor Q11 includes a drain electrode that is electrically connected to the first power source voltage VDD, a source electrode that is electrically connected to the first differential amplifying section 220, and a gate electrode that is electrically connected to gate and source electrodes of the P-channel transistor Q12. The P-channel transistor Q12 includes a drain electrode that is electrically connected to the first power source voltage VDD, and gate and source electrodes that are electrically connected to the gate electrode of the P-channel transistor Q11.

The first compensating section 214 includes a P-channel transistor Q13 and N-channel transistor Q16 to provide the second current mirror 216 with a bias current that is substantially the same as the first bias current outputted from the P-channel transistor Q12.

The P-channel transistor Q13 includes a drain electrode that is electrically connected to the first current mirror 212, a gate electrode that is electrically connected to the second power source voltage VSS, and a source electrode that is electrically connected to the N-channel transistor Q16.

The N-channel transistor Q16 includes a drain electrode that is electrically connected to the source electrode of the P-channel transistor Q13, a gate electrode that is electrically connected to the first power source voltage VDD, and a source electrode that is electrically connected to the second current mirror 216. The N-channel transistor Q16 reduces bias currents applied to the first and second differential amplifying sections 220 and 230, and increases differential amplified voltage outputted from the first and second differential amplifying sections 220 and 230.

The second current mirror 216 includes N-channel transistors Q14 and Q15. The N-channel transistor Q14 includes drain and gate electrodes that are electrically connected to the first compensating section 214 to receive the bias current, and a source electrode that is electrically connected to the second power source voltage VSS. The N-channel transistor Q15 includes a drain electrode that is electrically connected to the second differential amplifying section 230, a gate electrode that is electrically connected to the gate electrode of the N-channel transistor Q14, and a source electrode that is electrically connected to the second power source voltage VSS. Therefore, the second current mirror 216 controls to apply the second bias current to the second differential amplifying section 230.

The first differential amplifying section 220 includes a P-channel differential pair having a third current mirror 222 of N-channel. The first differential amplifying section 220 amplifies a difference between the input voltage VIN and the output voltage VOUT fed back from an output terminal of the output section 240 to form a first amplified voltage based on the first bias current provided from the biasing section 210. The first amplified voltage is applied to the output section 240.

In detail, the P-channel differential pair includes P-channel transistors Q21 and Q22. The P-channel transistor Q21 includes a drain electrode that is electrically connected to the first current mirror 212, a gate electrode that is electrically connected to the output terminal of the output section 240 to receive the output voltage VOUT, and a source electrode that is electrically connected to the third current mirror 222 of N-channel. The P-channel transistor Q22 includes a drain electrode that is electrically connected to the first current mirror 212, a gate electrode that is receives the input voltage VIN, and a source electrode that is electrically connected to the third current mirror 222.

The third current mirror 222 includes N-channel transistors Q23 and Q24. The N-channel transistor Q23 includes gate and drain electrodes that are electrically connected to the source electrode of the P-channel transistor Q21, and a source electrode that is electrically connected to the second power source voltage VSS. The N-channel transistor Q24 includes gate electrode that is electrically connected to the gate electrode of the N-channel transistor Q23, a source electrode that is electrically connected to the second power source voltage VSS, and a drain electrode that is electrically connected to the source electrode of the P-channel transistor Q22 and the output section 240.

The second differential amplifying section 230 includes an N-channel differential pair having P-channel current mirror 232. The second differential amplifying section 230 amplifies a difference between the input voltage VIN and the output voltage VOUT fed back from the output terminal of the output section 240 to form a second amplified voltage based on the second bias current pulled down by the biasing section 230. The second amplified voltage is applied to the output section 240.

In detail, the P-channel current mirror 232 includes P-channel transistors Q31 and Q32. The P-channel transistor Q31 includes a drain electrode that is electrically connected to the first power source voltage VDD, and a source electrode that is electrically connected to the N-channel differential pair and the output section 240. The P-channel transistor Q32 includes drain and gate electrodes that are electrically connected to a drain electrode of the P-channel transistor Q31, and a source electrode that is electrically connected to the N-channel differential pair.

The N-channel differential pair includes N-channel transistors Q33 and Q34. The N-channel transistors Q33 includes a drain electrode that is electrically connected to the source electrode of the P-channel transistor Q31, a gate electrode that is electrically connected to the first differential amplifying section 220 to receive the input voltage VIN, and a source electrode that is electrically connected to the N-channel transistor Q15 of the second current mirror 216. The N-channel transistor Q34 includes a drain electrode that is electrically connected to the source electrode of the P-channel transistor Q32, a source electrode that is electrically connected to the P-channel transistor Q15 of the second current mirror 216, and a gate electrode that is electrically connected to the output section 240.

The output section 240 includes a first output compensating section 242 and a second output compensating section 244. The output section 240 attenuates a difference between the first amplified voltage and the second amplified voltage to output the output voltage VOUT. The output voltage VOUT is fed back to the first and second differential amplifying sections 220 and 230.

In detail, the first output compensating section 242 includes P-channel transistors Q41 and Q42. The P-channel transistor Q41 includes a drain electrode that is electrically connected to the first power source voltage VDD, and a gate electrode that is electrically connected to the second differential amplifying section 230. The P-channel transistor Q42 includes a drain electrode that is electrically connected to a source electrode of the P-channel transistor Q41, a gate electrode that is electrically connected to the second power source voltage VSS, and a source electrode that is electrically connected to the output terminal, the first and second differential amplifying sections 220 and 230.

When the P-channel transistor Q41 is turned on, the P-channel transistor Q41 pulls up the output voltage VOUT to output the first power source voltage VDD in response to the second amplified signal applied to the gate electrode, and the P-channel transistor Q41 applies the first power source voltage VDD to the P-channel transistor Q42 though the source electrode. The P-channel transistor Q42 applies the first power source voltage VDD to the output terminal and the first and second differential amplifying sections 220 and 230.

In FIG. 3, the second power source voltage VSS is applied to the gate electrode of the P-channel transistor Q42 that controls output of the pull up voltage in response to the second amplified voltage. However, a separate bias voltage may be applied to the gate electrode of the P-channel transistor Q42.

The second output compensating section 244 includes N-channel transistors Q43 and Q44. The N-channel transistor Q43 includes a source electrode that is electrically connected to the second power source voltage VSS, and a gate electrode that is electrically connected to the first differential amplifying section 220. The N-channel transistor Q44 includes a drain electrode that is electrically connected to the output terminal, a gate electrode that is electrically connected to the first power source voltage VDD, and a source electrode that is electrically connected to a drain electrode of the N-channel transistor Q43.

When the N-channel transistor Q43, the N-channel transistor Q43 pulls down the output voltage VOUT to output the second power source voltage VSS in response to the first amplified signal applied to the gate electrode, and the N-channel transistor Q43 applies the second power source voltage VSS to the N-channel transistor Q44 though the source electrode. The N-channel transistor Q44 applies the second power source voltage VSS to the output terminal and the first and second differential amplifying sections 220 and 230.

In FIG. 3, the first power source voltage VDD is applied to the gate electrode of the N-channel transistor Q44 that controls output of the pull down voltage in response to the first amplified voltage. However, a separate bias voltage may be applied to the gate electrode of the N-channel transistor Q44.

According to the present embodiment, the output section 240 and the biasing section 210 include transistors that compensate offset voltage of the first and second differential amplifying sections 220 and 230, so that the output section 240 attenuates a difference between the first amplified voltage and the second amplified voltage to output the output voltage VOUT.

Figure 4:
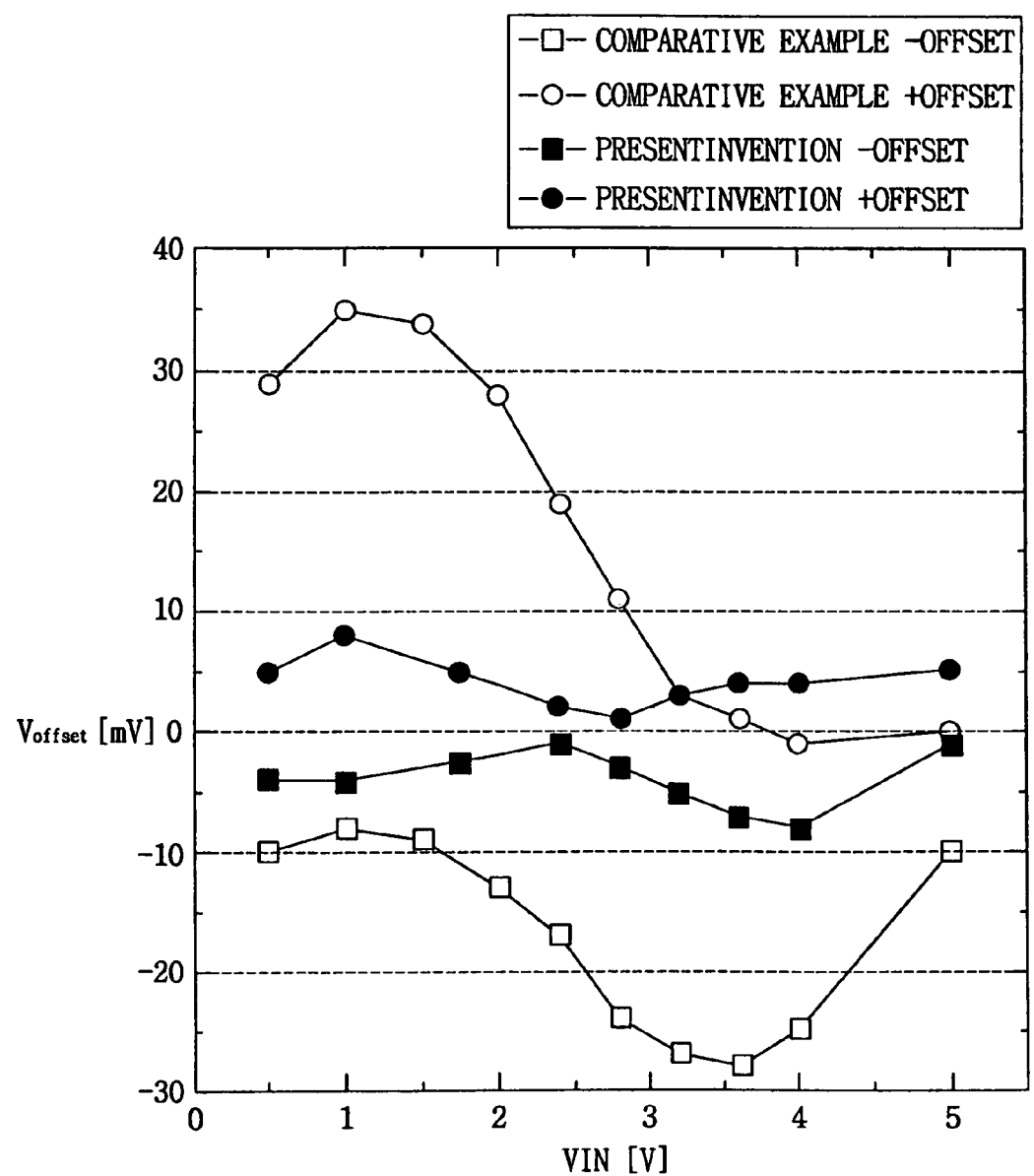
FIG. 4 is a graph showing a relationship between an input voltage and an offset voltage.

FIG. 4 is a graph showing a relationship between input voltages and offset voltages. Especially, FIG. 4 shows difference between comparative example of conventional push-pull amplifier of FIG. 1 and the exemplary embodiment of FIG. 3.

Referring to FIG. 4, a difference between positive and negative offset voltages of the comparative example (or conventional push-pull amplifier) is ranged from about 30 mV to about 40 mV. However, a difference between positive and negative offset voltage of the embodiment of the present invention (or push-pull amplifier according to the present invention) is ranged from about 4 mV to about 10 mV.

For example, when about 0.5V is inputted as the input voltage VIN, the negative and positive offset voltages of the conventional amplifier of comparative example are −10 mV and 30 mV, respectively. Therefore, the difference between the positive and negative offset voltages is about 40 mV.

However, the negative and positive offset voltages of the amplifier of the present invention are −5 mV and 5 mV, respectively. Therefore, the difference between the positive and negative offset voltages is about 10 mV.

Figure 1:
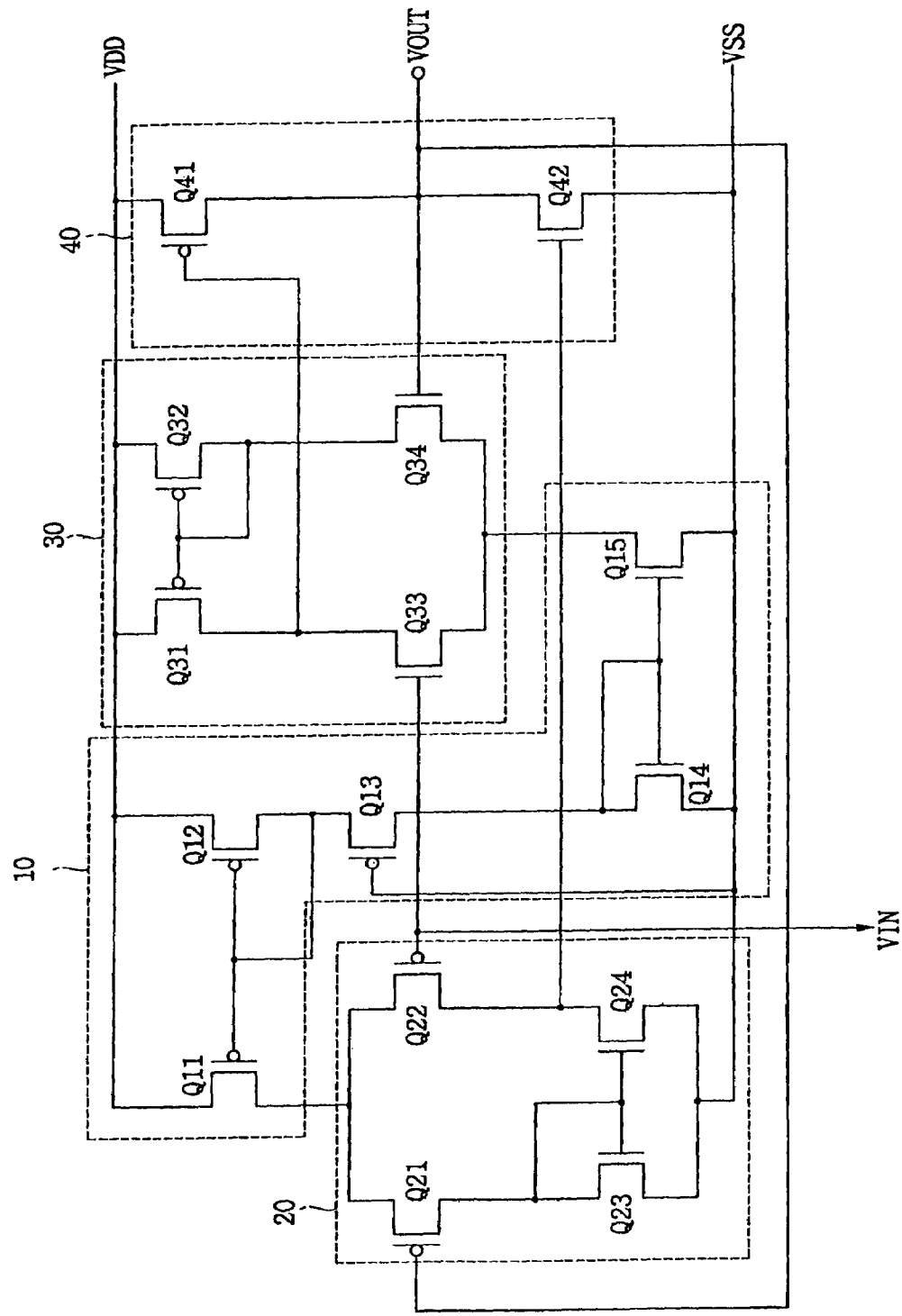
FIG. 1 is a circuit diagram illustrating a conventional push-pull amplifier.

When about 1V is inputted as the input voltage VIN into the conventional push-pull amplifier in FIG. 1 and the push-pull amplifier according to the present invention in FIG. 3, the negative and positive offset voltages of the conventional amplifier of comparative example are −8 mV and 35 mV, respectively. Therefore, the difference between the positive and negative offset voltages is about 43 mV.

However, the negative and positive offset voltages of the amplifier of the present invention are −5 mV and 8 mV, respectively. Therefore, the difference between the positive and negative offset voltages is about 13 mV.

That is, the push-pull amplifier according to the present invention reduces the offset voltage to be about a quarter of the offset voltage of the conventional push-pull amplifier.

A liquid crystal display (LCD) driver of an LCD panel may employ the push-pull amplifier. The LCD driver outputs analog signals, for example, such as RGB graphic signal (or data signal), a gate signal, etc. to control a gray scale of a display cell (or pixel). The data signals are transmitted by a plurality of buses or a plurality of source lines of thin film transistor screen to display an image, and being activated selectively in proper timing, the gate signal is transmitted by a plurality of gate lines to turn on or off a thin film transistor (TFT). Generally, the source line driver is used to drive the source line. The push-pull amplifier may be used for the LCD driver.

Figure 5:
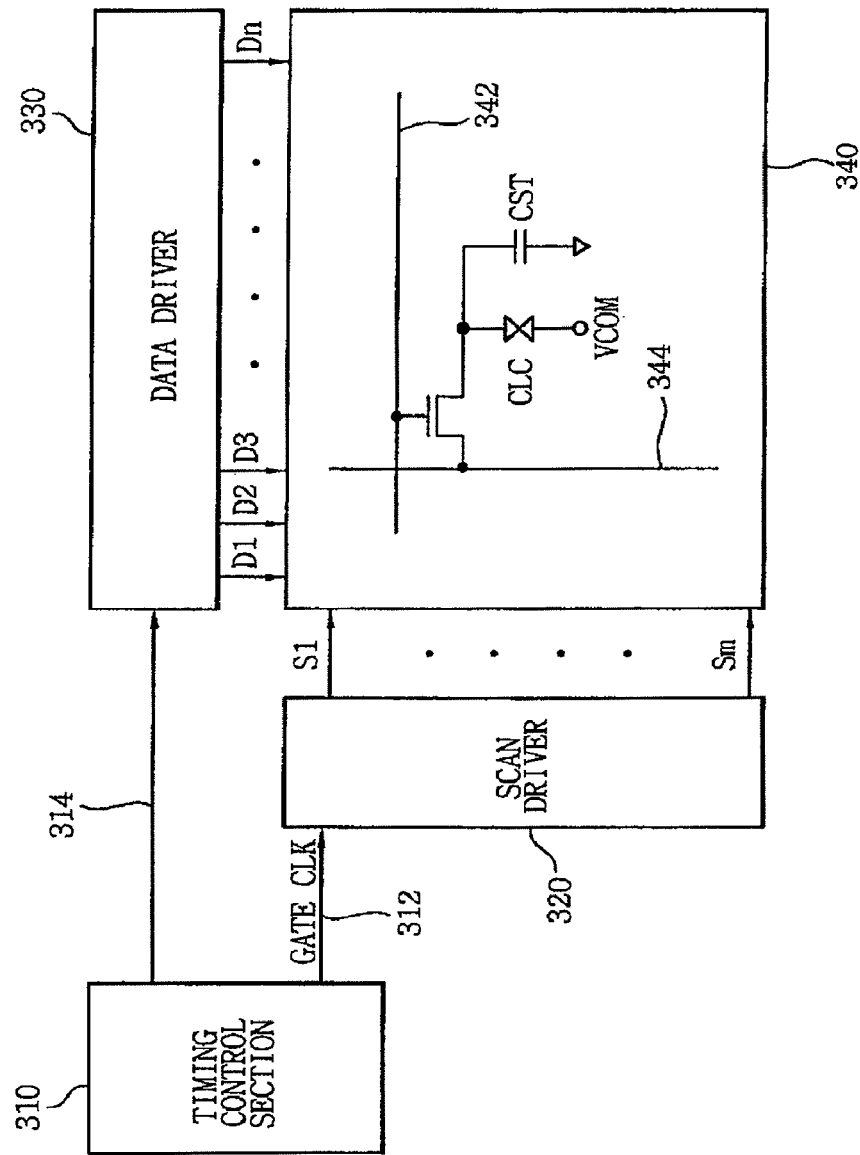
FIG. 5 is a schematic block diagram illustrating a liquid crystal display apparatus having a push-pull amplifier according to an exemplary embodiment of the present invention.

FIG. 5 is a schematic block diagram illustrating a liquid crystal display apparatus having a push-pull amplifier according to an exemplary embodiment of the present invention.

Referring to FIG. 5, a liquid crystal display apparatus includes a timing control section 310, a scan driver 320, a data driver 330 and a liquid crystal display panel 340. The scan driver 320 and the data driver 330 may be integrated on the liquid crystal display panel.

The timing control section 310 provides the scan driver 320 with column timing signal via a bus 312. Additionally, the timing control section 310 provides the data driver 330 with a video signal (data signal and control signal), for example, such as RGB signal via a bus 314.

The scan driver 320 outputs scan signals S1, . . . , Sm for selecting pixels in sequence based on the column timing signal.

The data driver 330 drives a data line 344 of the liquid crystal display panel 340. Generally, one scan driver 320 drivers all of scan lines 342.

The liquid crystal display panel 340 includes a plurality of the scan lines 342 and a plurality of data lines (or source lines) 344. Each pixel is surrounded by the scan lines 342 and data lines 344. The pixel includes a TFT, a liquid crystal capacitor CLC and a storage capacitor CST. The TFT includes a gate electrode that is electrically connected to the scan line, a source electrode that is electrically connected to the data line, and a drain electrode that is electrically connected to the liquid crystal capacitor CLC.

The data driver 330 may includes a plurality of data drivers. Generally, one data driver is formed per one hundred data lines. However, the data driver may drive more than two hundred data lines by multiplexing outputs of the data driver.

Figure 6:
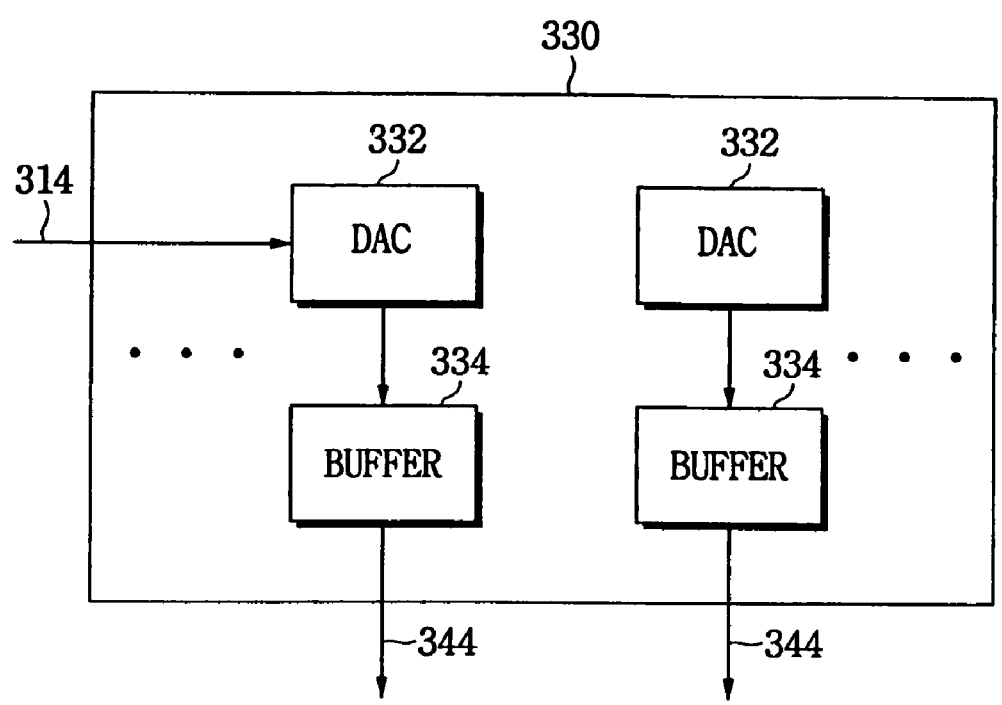
FIG. 6 is a schematic block diagram illustrating a data driver having a push-pull amplifier according to an exemplary embodiment of the present invention.

The data driver 330 includes a plurality of digital-analog converters (DAC) 332 and a plurality of buffers 334 as shown in FIG. 6.

FIG. 6 is a schematic block diagram illustrating a data driver having a push-pull amplifier according to an exemplary embodiment of the present invention.

Referring to FIG. 6, a DAC 332 receives video signals (data signal and control signal), for example, RGB signals, and converts the video signal into analog signals. The converted analog signals are applied to buffers 334.

The buffers 334 output analog voltage to the data lines for displaying images. The push-pull amplifier according to the present invention is formed in the buffers 334 that compensate offset voltage of the analog voltage. The compensated analog voltage is applied to the data lines.

The data driver according to the present invention may be integrated on the liquid crystal display panel with other devices that are used for the control of the liquid crystal display apparatus.

According to the present invention, additional transistors are formed in the output section and the biasing section to reduce offset voltage outputted from the output section.

Having described the exemplary embodiments of the present invention and its advantages, it is noted that various changes, substitutions and alterations can be made herein without departing from the spirit and scope of the invention as defined by appended claims.

What is claimed is:

1. A data driver comprising:
a digital-analog converter that receives image data to convert the image data into an analog voltage; and
a buffer that outputs a second power source voltage based on a first power source voltage and a first amplified voltage corresponding to the analog voltage, and outputs a first power source voltage based on a second power source voltage and a second amplified voltage corresponding to the analog voltage.

2. The data driver of claim 1, wherein the buffer comprises:
a biasing section that outputs first and second bias currents based on the first and second power source voltages;
a first differential amplifying section that outputs the first amplified voltage based on the first bias current when the analog voltage is applied to the first differential amplifying section;
a second differential amplifying section that outputs the second amplified voltage based on the second bias current when the analog voltage is applied to the second differential amplifying section; and an output section that outputs the second power source voltage based on the first amplified voltage and the first power source voltage, and outputs the first power source voltage based on the second amplified voltage and the second power source voltage.

3. The data driver of claim 2, wherein the output section comprises:

a first output compensating section that outputs the first power source voltage and feeds back the first power source voltage to the first and second differential amplifying sections based on the second amplified voltage and the second power source voltage; and a second output compensating section that outputs the second power source voltage and feeds back the second power source voltage to the first and second differential amplifying sections based on the first amplified voltage and the first power source voltage.

4. The data driver of claim 3, wherein the first output compensating section comprises:

a first P-MOS transistor including a first current electrode that is electrically connected to the first power source voltage, and a control electrode that is electrically connected to the second differential amplifying section; and a second P-MOS transistor including a first current electrode that is electrically connected to a second current electrode of the first P-MOS transistor, a control electrode that is electrically connected to the second power source voltage, and a second current electrode that is electrically connected to an output terminal of the output section, and first and second differential amplifying sections.

5. The data driver of claim 4, wherein the second output compensating section comprises:

a first N-MOS transistor including a first current electrode that is electrically connected to the second power source voltage, and a control electrode that is electrically connected to the first differential amplifying section; and a second N-MOS transistor including a first current electrode that is electrically connected to a second current electrode of the first N-MOS transistor, a control electrode that is electrically connected to the first power source voltage, and a second current electrode that is electrically connected to an output terminal of the output section, and first and second differential amplifying sections.

6. The data driver of claim 2, wherein the biasing section comprises:

a first current mirror that provides the first bias current to the first differential amplifying section based on the first power source voltage;

a second current mirror that provides the second bias current to the second differential amplifying section based on the second power source voltage; and a bias compensating section that is electrically connected to the first and second current mirrors to control outputs of the first and second bias currents.

7. The data driver of claim 6, wherein the bias compensating section comprises:

a P-MOS transistor including a control electrode that is electrically connected to the second power source voltage, and a first current electrode that is electrically connected to an output terminal of the first current mirror to receive a second current from the first current mirror; and a N-MOS transistor including a control electrode that is electrically connected to the first power source voltage, and a first current electrode that is electrically connected to a second current electrode of the P-MOS transistor.

8. A display apparatus comprising:

a display panel including a data line, a scan line and a switching device formed in a region defined by the data line and the scan line;

a timing control section that outputs image data, and first and second timing signals;

a scan driver that outputs scan signal that activates the scan line based on the first timing signal; and a data driver including a digital-analog converter that receives the image data to convert the image data into an analog voltage and a buffer that outputs a second power source voltage based on a first power source voltage and a first amplified voltage corresponding to the analog voltage and outputs a first power source voltage based on a second power source voltage and a second amplified voltage corresponding to the analog voltage.

9. The display apparatus of claim 8, wherein the display panel is a liquid crystal display panel having a liquid crystal capacitor that is electrically connected to the switching device.

10. The display apparatus of claim 8, wherein the data driver is formed on the display panel.

11. The display apparatus of claim 8, wherein the data driver comprises polysilicon thin film transistor.

* * * * *